US012805112B2

(12) United States Patent
Qu

(10) Patent No.: US 12,805,112 B2
(45) Date of Patent: Nov. 17, 2026

(54) DISPLAY DEVICE

(71) Applicant: SHARP KABUSHIKI KAISHA, Sakai City (JP)

(72) Inventor: Yang Qu, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 882 days.

(21) Appl. No.: 18/007,658

(22) PCT Filed: Jun. 17, 2020

(86) PCT No.: PCT/JP2020/023672
§ 371 (c)(1),
(2) Date: Dec. 1, 2022

(87) PCT Pub. No.: WO2021/255844
PCT Pub. Date: Dec. 23, 2021

(65) Prior Publication Data

US 2023/0337448 A1 Oct. 19, 2023

(51) Int. Cl.

| | |
|---|---|
| ***H10K 50/115*** | (2023.01) |
| ***H10K 50/16*** | (2023.01) |
| ***H10K 59/12*** | (2023.01) |
| ***H10K 59/35*** | (2023.01) |
| ***H10K 102/00*** | (2023.01) |

(52) U.S. Cl.
CPC ......... *H10K 50/115* (2023.02); *H10K 50/166* (2023.02); *H10K 59/35* (2023.02); *H10K 59/12* (2023.02); *H10K 2102/351* (2023.02)

(58) Field of Classification Search
CPC ......... H10K 50/115; H10K 50/13–131; H10K 50/166; H10K 59/35
See application file for complete search history.

(56) References Cited

U.S. PATENT DOCUMENTS

| | | | |
|---|---|---|---|
| 2009/0001349 | A1 | 1/2009 | Kahen |
| 2010/0108984 | A1 | 5/2010 | Cho et al. |

(Continued)

FOREIGN PATENT DOCUMENTS

| | | | |
|---|---|---|---|
| JP | 2010114079 | A | 5/2010 |
| JP | 2010532409 | A | 10/2010 |

(Continued)

*Primary Examiner* — Steven B Gauthier
*Assistant Examiner* — E. Rhett Cheek
(74) *Attorney, Agent, or Firm* — ScienBiziP, P.C.

(57) ABSTRACT

In a display device, in a first subpixel, a first quantum dot layer constitutes a quantum dot light-emitting layer that contributes to light emission, and a second quantum dot layer and a third quantum dot layer constitute non-light-emitting layers that do not contribute to light emission. In the second subpixel, the second quantum dot layer constitutes a quantum dot light-emitting layer that contributes to light emission, and the first quantum dot layer and the third quantum dot layer constitute non-light-emitting layers that do not contribute to light emission. In the third subpixel, the third quantum dot layer constitutes a quantum dot light-emitting layer that contributes to light emission, and the first quantum dot layer and the second quantum dot layer constitute non-light-emitting layers that do not contribute to light emission.

12 Claims, 13 Drawing Sheets

(56) References Cited

U.S. PATENT DOCUMENTS

| | | | | |
|---|---|---|---|---|
| 2013/0069036 | A1* | 3/2013 | Miyata | C09K 11/025 438/35 |
| 2018/0102093 | A1* | 4/2018 | Kim | G01J 1/08 |
| 2018/0108872 | A1* | 4/2018 | Li | H10K 50/156 |
| 2018/0254421 | A1* | 9/2018 | Kinge | H10K 50/15 |
| 2020/0091454 | A1* | 3/2020 | Jang | H10K 50/115 |
| 2020/0280009 | A1* | 9/2020 | Lin | H10K 59/35 |
| 2021/0351320 | A1 | 11/2021 | Ueta | |

FOREIGN PATENT DOCUMENTS

| | | | |
|---|---|---|---|
| JP | 2012234748 | A | 11/2012 |
| WO | 2011148791 | A1 | 12/2011 |
| WO | 2020084731 | A1 | 4/2020 |

* cited by examiner (a)

(b)

(c)

DISPLAY DEVICE

TECHNICAL FIELD

The disclosure relates to a display device and a method for manufacturing a display device.

BACKGROUND ART

In recent years, self-luminous display devices have been developed and put into practical use in place of non-self-luminous liquid crystal display devices. In such a display device that does not require a backlight device, a light-emitting element, such as an organic light-emitting diode (OLED) or a quantum dot light-emitting diode (QLED), for example, is provided for each pixel.

A self-luminous display device as described above is provided with a first electrode, a second electrode, and a function layer that is disposed between the first electrode and the second electrode and that includes at least a light-emitting layer. Furthermore, regarding such a display device, in order to cost-effectively and easily manufacture a high-definition display device, for example, formation of at least one layer included in the function layer, such as the light-emitting layer, for example, using a technique of dropping droplets such as a spin-coating method or an ink-jet application method instead of formation using the existing vapor deposition technique has been proposed (refer to, for example, PTL 1 below).

CITATION LIST

Patent Literature

PTL 1: JP 2012-234748 A

SUMMARY

Technical Problem

In a display device and a method for manufacturing a display device in related art as described above, a solution (droplets) containing a functional material (that is, luminescent material) for the light-emitting layer is dropped or applied onto a hole transport layer to form the light-emitting layer, for example. In the display device and the method for manufacturing the display device in related art, with combining photolithography, subpixels (pixel pattern) of RGB each having a light-emitting layer corresponding to respective one of three colors of RGB are formed for color-coding with the RGB.

However, in the display device and the method for manufacturing the display device in related art as described above, for example, in a case where quantum dots are used as the above-described luminescent material, the quantum dots may be deteriorated by irradiation light at the time of exposure, a developing solution at the time of development, and the like, which are used in the photolithography method, and light emission performance of the light-emitting layer and thus display performance may be deteriorated. Specifically, in the display device and the method for manufacturing the display device in related art, in a case where ultraviolet light is used as the above-described irradiation light, or in a case where alkali developing solution such as TMAH or KOH and an organic solvent developing solution such as toluene are used as the developing solution, ligand coordinated to quantum dots may be released, and thus degradation may occur in the quantum dots, and quantum efficiency (Photoluminescence Quantum Yield (PLQY)) of the quantum dots may also be significantly reduced. As a result, in the display device and the method for manufacturing the display device in related art, the light emission performance of the light-emitting layer may be deteriorated and the display performance may also be deteriorated. In particular, in a case where cadmium-free quantum dots such as InP-based, ZnSe-based, or PbS-based quantum dots are used instead of quantum dots containing a highly toxic material such as cadmium, significant deterioration may occur in the quantum dots, and it is difficult to perform the above-described color-coding with the RGB using the photolithography method.

In light of the problems described above, an object of the disclosure is to provide a display device and a method for manufacturing a display device that can prevent display performance deterioration even when the light-emitting layer including quantum dots is color-coded using the photolithography method.

In light of the problems described above, an object of the present invention is to provide a display device and a method for manufacturing a display device that can prevent display performance deterioration even when the light-emitting layer including quantum dots is color-coded using the photolithography method.

Solution to Problem

In order to achieve the above object, a display device according to the disclosure is a display device including a display region including a first subpixel, a second subpixel, and a third subpixel having luminescent colors different from each other, wherein each of the first subpixel, the second subpixel, and the third subpixel includes a first electrode, a second electrode, and a function layer provided between the first electrode and the second electrode, the function layer includes a first quantum dot layer containing first quantum dots, a second quantum dot layer containing second quantum dots, and a third quantum dot layer containing third quantum dots, the first quantum dot layer, the second quantum dot layer, and the third quantum dot layer are sequentially layered from the first electrode side toward the second electrode side, in the first subpixel, the first quantum dot layer constitutes a quantum dot light-emitting layer that contributes to light emission, and the second quantum dot layer and the third quantum dot layer constitute non-light-emitting layers that do not contribute to light emission, in the second subpixel, the second quantum dot layer constitutes a quantum dot light-emitting layer that contributes to light emission, and the first quantum dot layer and the third quantum dot layer constitute non-light-emitting layers that do not contribute to light emission, and in the third subpixel, the third quantum dot layer constitutes a quantum dot light-emitting layer that contributes to light emission, and the first quantum dot layer and the second quantum dot layer constitute non-light-emitting layers that do not contribute to light emission.

In the display device as described above, the first subpixel, the second subpixel, and the third subpixel having luminescent colors different from each other are provided in the display region. Each of the first subpixel, the second subpixel, and the third subpixel includes the first quantum dot layer, the second quantum dot layer, and the third quantum dot layer sequentially layered from the first electrode side toward the second electrode side. In the first subpixel, the first quantum dot layer constitutes the quantum dot light-emitting layer that contributes to light emission, and the second quantum dot layer and the third quantum dot layer constitute the non-light-emitting layers that do not contribute to light emission. In the second subpixel, the second quantum dot layer constitutes the quantum dot light-emitting layer that contributes to light emission, and the first quantum dot layer and the third quantum dot layer constitute the non-light-emitting layers that do not contribute to light emission. In the third subpixel, the third quantum dot layer constitutes the quantum dot light-emitting layer that contributes to light emission, and the first quantum dot layer and the second quantum dot layer constitute the non-light-emitting layers that do not contribute to light emission. Thus, three subpixels can be formed without using the developing solution even when the light-emitting layer including quantum dots is color-coded using the photolithography method. As a result, it is possible to prevent the quantum dots contained in the quantum dot light-emitting layer in each subpixel from deteriorating, thereby preventing the deterioration of the light emission performance and thus the display performance.

A method for manufacturing a display device according to the disclosure is a method for manufacturing a display device including a display region including a first subpixel, a second subpixel, and a third subpixel having luminescent colors different from each other, each of the first subpixel, the second subpixel, and the third subpixel including a first electrode, a second electrode, and a function layer provided between the first electrode and the second electrode, the method including a first solution dropping step of dropping a first solution onto the first electrode, the first solution containing first quantum dots and for forming a first quantum dot layer, a first quantum dot layer forming step of performing a first oxidation treatment on each of a drop region corresponding to the second subpixel and a drop region corresponding to the third subpixel excluding a drop region corresponding to the first subpixel among a drop region of the first solution dropped to form a quantum dot light-emitting layer, in which the first quantum dot layer contributes to light emission, in the drop region corresponding to the first subpixel and to form a non-light-emitting layer, in which the first quantum dot layer does not contribute to light emission, in each of the drop region corresponding to the second subpixel and the drop region corresponding to the third subpixel, a second solution dropping step of dropping a second solution onto the first quantum dot layer, the second solution containing second quantum dots and for forming a second quantum dot layer, a second quantum dot layer forming step of performing a second oxidation treatment on each of a drop region corresponding to the first subpixel and a drop region corresponding to the third subpixel excluding a drop region corresponding to the second subpixel among a drop region of the second solution dropped to form a quantum dot light-emitting layer, in which the second quantum dot layer contributes to light emission, in the drop region corresponding to the second subpixel and to form a non-light-emitting layer, in which the second quantum dot layer does not contribute to light emission, in each of the drop region corresponding to the first subpixel and the drop region corresponding to the third subpixel, a third solution dropping step of dropping a third solution onto the second quantum dot layer, the third solution containing third quantum dots and for forming a third quantum dot layer, and a third quantum dot layer forming step of performing a third oxidation treatment on each of a drop region corresponding to the first subpixel and a drop region corresponding to the second subpixel excluding a drop region corresponding to the third subpixel among a drop region of the third solution dropped to form a quantum dot light-emitting layer, in which the third quantum dot layer contributes to light emission, in the drop region corresponding to the third subpixel and to form a non-light-emitting layer, in which the third quantum dot layer does not contribute to light emission, in each of the drop region corresponding to the first subpixel and the drop region corresponding to the second subpixel.

In the method for manufacturing the display device as described above, the first solution for forming the first quantum dot layer is dropped onto the first electrode and thereafter the first oxidation treatment is performed, so that the quantum dot light-emitting layer in which the first quantum dot layer contributes to light emission is formed in the drop region corresponding to the first subpixel, and the non-light-emitting layer in which the first quantum dot layer does not contribute to light emission is formed in each of the drop region corresponding to the second subpixel and the drop region corresponding to the third subpixel. Subsequently, the second solution for forming the second quantum dot layer is dropped onto the first quantum dot layer and thereafter the second oxidation treatment is performed, so that the quantum dot light-emitting layer in which the second quantum dot layer contributes to light emission is formed in the drop region corresponding to the second subpixel, and the non-light-emitting layer in which the second quantum dot layer does not contribute to light emission is formed in each of the drop region corresponding to the first subpixel and the drop region corresponding to the third subpixel. Thereafter, the third solution for forming the third quantum dot layer is dropped onto the second quantum dot layer and thereafter the third oxidation treatment is performed, the quantum dot light-emitting layer in which the third quantum dot layer contributes to light emission is formed in the drop region corresponding to the third subpixel, and the non-light-emitting layer in which the third quantum dot layer does not contribute to light emission is formed in each of the drop region corresponding to the first subpixel and the drop region corresponding to the second subpixel. Thus, three subpixels can be formed without using the developing solution. As a result, display performance deterioration can be prevented even when the light-emitting layer including quantum dots is color-coded using the photolithography method.

Advantageous Effects of Disclosure

Display performance deterioration can be prevented even when a light-emitting layer including quantum dots is color-coded using a photolithography method.

DESCRIPTION OF EMBODIMENTS

Embodiments of the disclosure will be described below in detail with reference to the drawings. Note that the disclosure is not limited to the embodiments described below. In the following description, a "same layer" means that the layer is formed through the same process (film formation process), a "lower layer" means that the layer is formed in a process before the layer being compared, and an "upper layer" means that the layer is formed in a process after the layer being compared. In each of the drawings, the dimensions of constituent elements are not precisely illustrated as the actual dimensions of the constituent elements and the dimensional proportions of each of the constituent elements.

EMBODIMENTS

Figure 1:
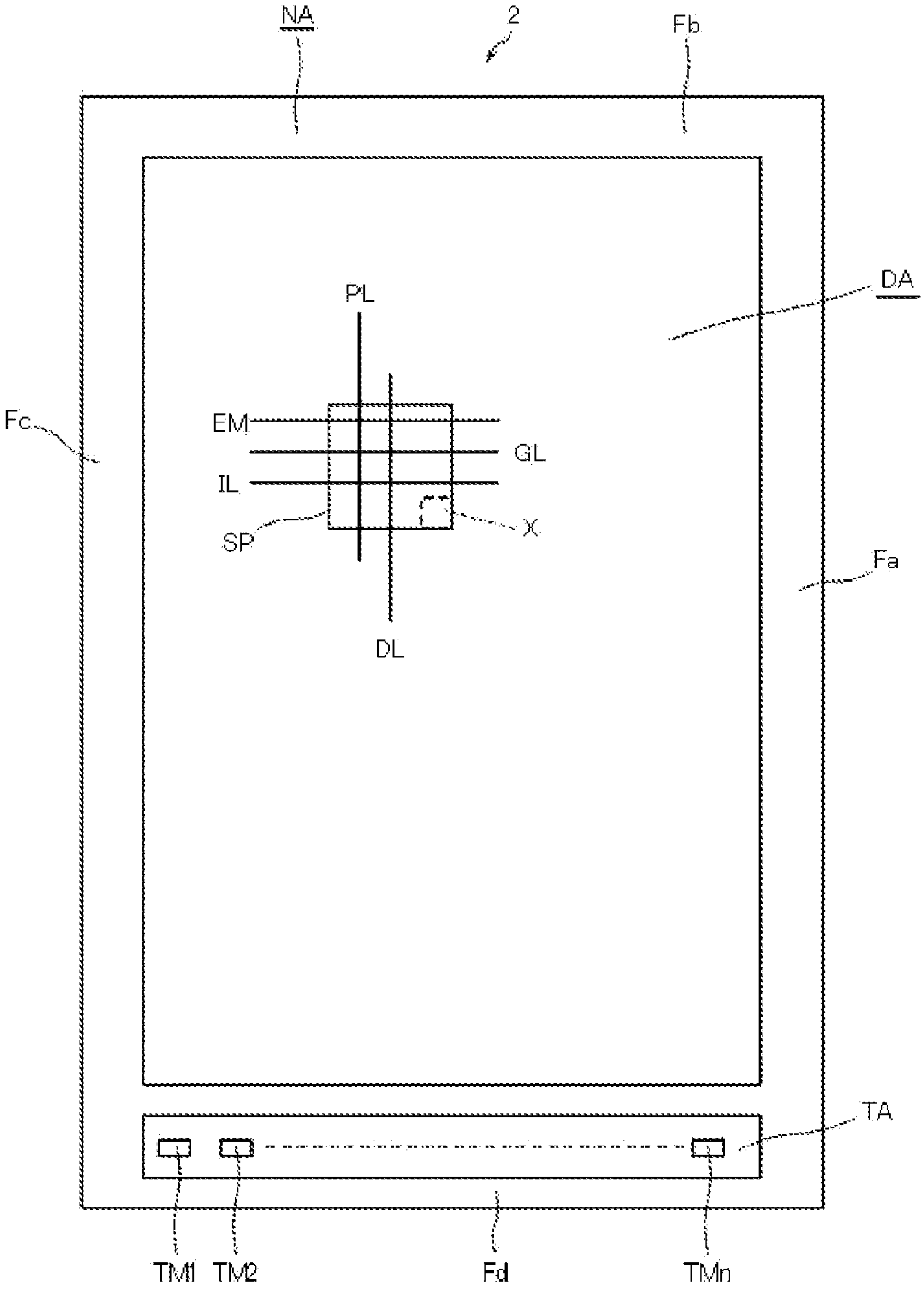
FIG. 1 is a schematic view illustrating a configuration of a display device according to an embodiment of the disclosure.
Figure 2:
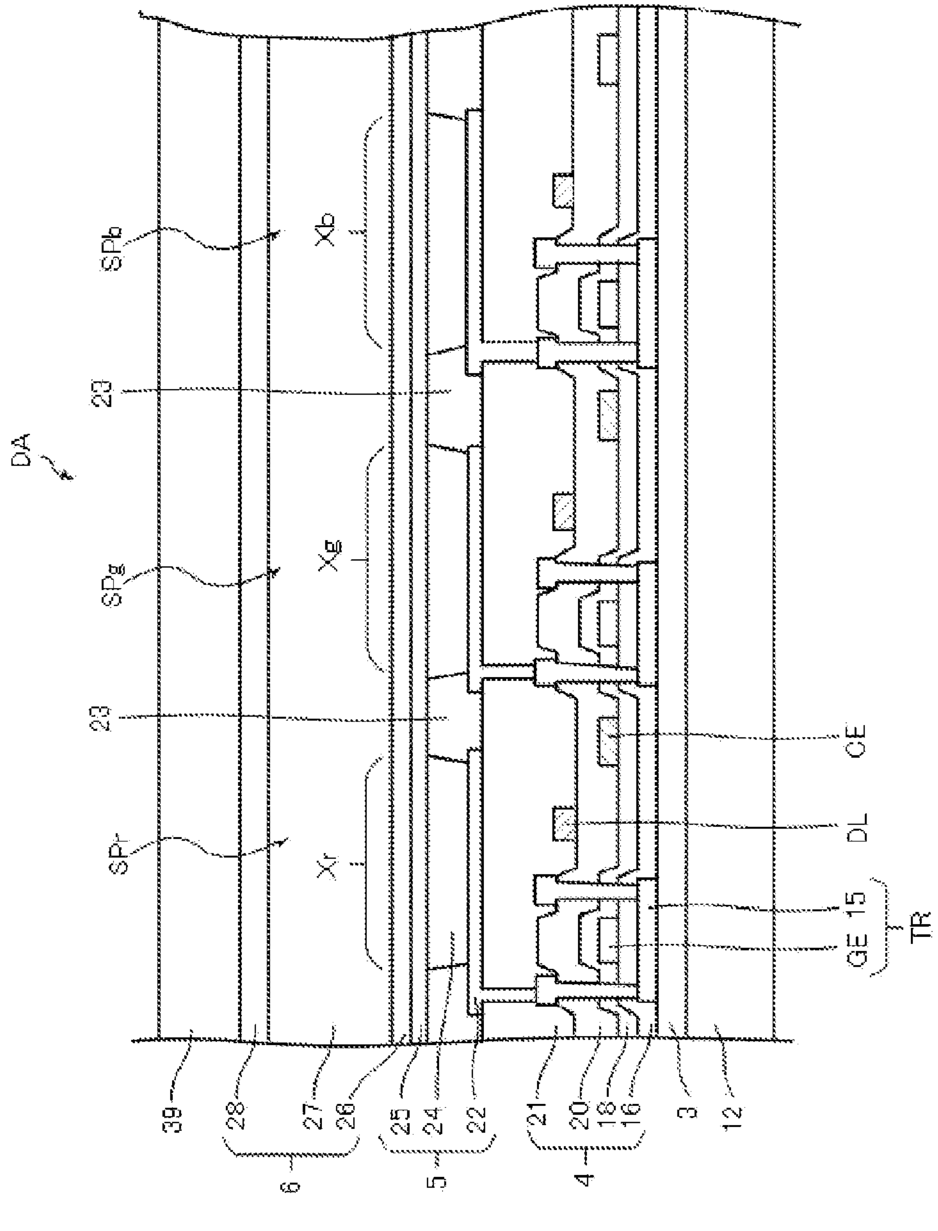
FIG. 2 is a view explaining a configuration of main portions of the display device illustrated in FIG. 1.
Figure 3:
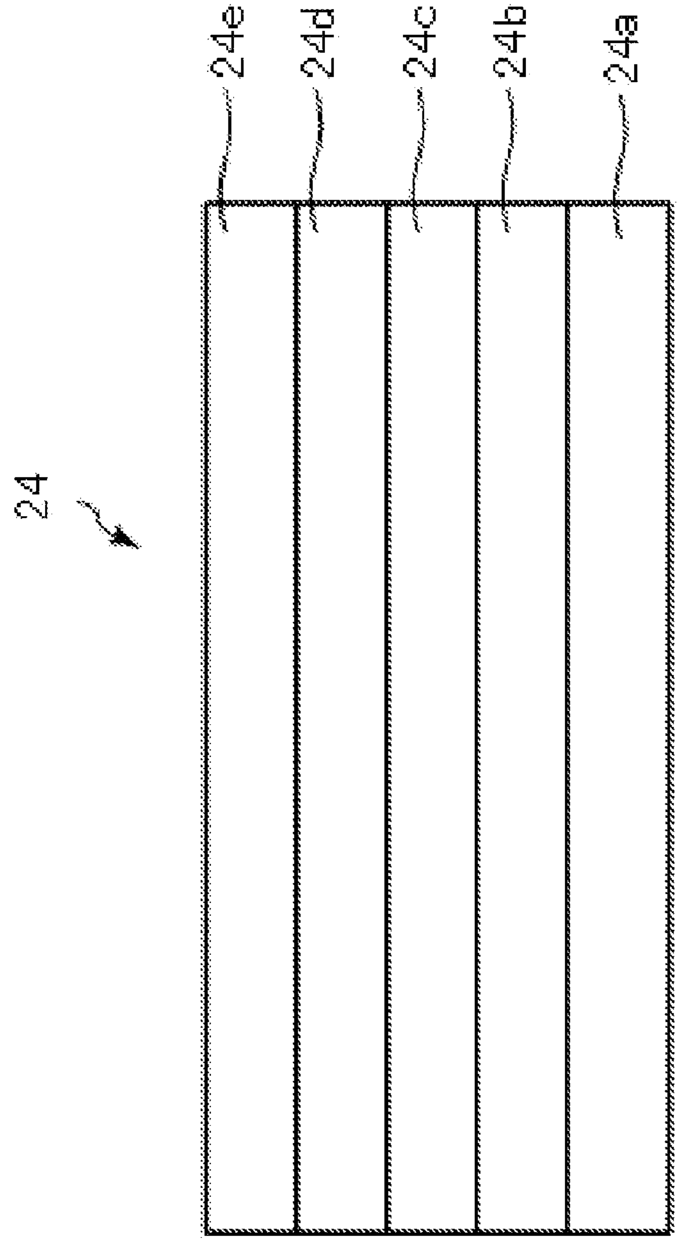
FIG. 3 is a view explaining a specific configuration of a function layer illustrated in FIG. 2.
Figure 4:
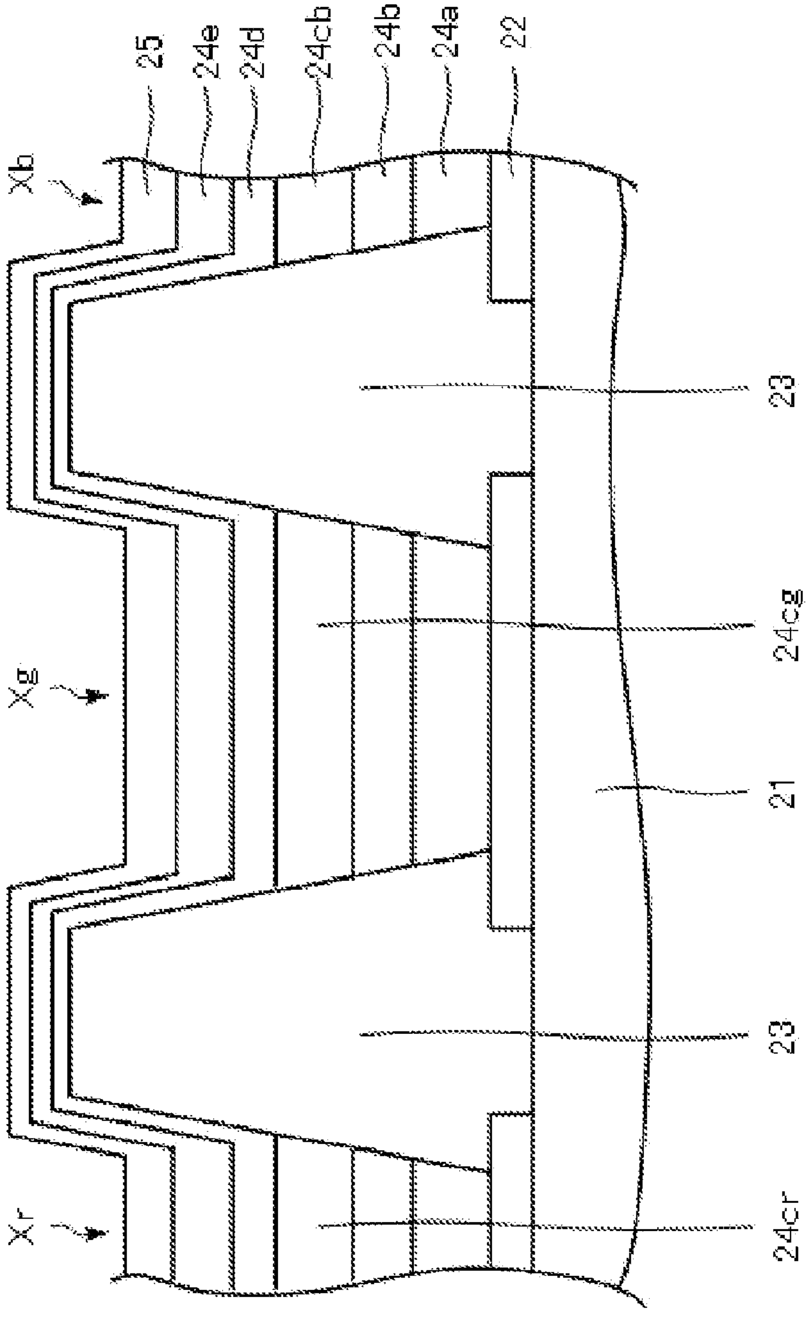
FIG. 4 is a view explaining a specific configuration example of a light-emitting element illustrated in FIG. 2.

FIG. 1 is a schematic view illustrating a configuration of a display device according to an embodiment of the disclosure. FIG. 2 is a view explaining a configuration of main portions of the display device illustrated in FIG. 1. FIG. 3 is a view explaining a specific configuration of a function layer illustrated in FIG. 2. FIG. 4 is a view explaining a specific configuration example of a light-emitting element illustrated in FIG. 2.

As illustrated in FIG. 1 and FIG. 2, in a display device 2 of the present embodiment, a barrier layer 3, a thin film transistor (TFT) layer 4, a top emission light-emitting element layer 5, and a sealing layer 6 are provided in this order on a base material 12, and a plurality of subpixels SP are formed in a display region DA. A frame region NA surrounding the display region DA includes four side edges Fa to Fd, and a terminal portion TA for mounting an electronic circuit board (an IC chip, a FPC, or the like) is formed at the side edge Fd. The terminal portion TA includes a plurality of terminals TM1, TM2 and TMn (where n is an integer of 2 or greater). As illustrated in FIG. 1, the plurality of terminals TM1, TM2, and TMn are provided along one side of the four sides of the display region DA. Note that driver circuits (not illustrated) may be formed on each of the side edges Fa to Fd.

Each of the plurality of subpixels SP includes a first subpixel, a second subpixel, and a third subpixel having luminescent colors different from each other. Specifically, for example, the first subpixel is a red subpixel SPr that emits red light, the second subpixel is a green subpixel SPg that emits green light, and the third subpixel is a blue subpixel SPb that emits blue light. In the subpixel SPr, the subpixel SPg, and the subpixel SPb, configurations are different from each other only for the light-emitting layers (quantum dot light-emitting layers) included in the light-emitting elements described below, and the other configurations are identical. That is, each of the subpixels SP includes a first electrode, a second electrode, and a function layer provided between the first electrode and the second electrode (details will be described below).

The base material 12 may be a glass substrate or a flexible substrate including a resin film such as polyimide. The base material 12 may also configure a flexible substrate formed of two layers of resin films and an inorganic insulating film interposed between these resin films. Furthermore, a film such as a polyethylene terephthalate (PET) film may be applied to a lower face of the base material 12. When a flexible substrate is used as the base material 12, the display device 2 having flexibility, that is, a flexible display device, may also be formed.

The barrier layer 3 is a layer that inhibits foreign matters such as water and oxygen from penetrating the thin film transistor layer 4 and the light-emitting element layer 5. For example, the barrier layer 3 can be configured by a silicon oxide film, a silicon nitride film, or a silicon oxynitride film, or a layered film thereof formed by chemical vapor deposition (CVD).

As illustrated in FIG. 2, the thin film transistor layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 20 as an upper layer overlying the second metal layer, a third metal layer (including a data signal line DL) as an upper layer overlying the inorganic insulating film 20, and a flattening film 21 as an upper layer overlying the third metal layer.

The semiconductor layer described above is configured by, for example, amorphous silicon, low-temperature polycrystalline silicon (LTPS), or an oxide semiconductor, and a thin film transistor TR is configured to include the gate electrode GE and the semiconductor film 15.

Note that, although the thin film transistor TR of a top gate type is exemplified in the present embodiment, the thin film transistor TR may be a thin film transistor of a bottom gate type.

A light-emitting element X and a control circuit thereof are provided for each of the subpixels SP in the display region DA, and the control circuit and wiring lines connected to the control circuit are formed in the thin film transistor layer 4. Examples of the wiring lines connected to the control circuit include a scanning signal line GL and a light emission control line EM both formed in the first metal layer, an initialization power source line IL formed in the second metal layer, and the data signal line DL and a high voltage power source line PL both formed in the third metal layer. The control circuit includes a drive transistor that controls the current of the light-emitting element X, a writing transistor that electrically connects to a scanning signal line, a light emission control transistor that electrically connects to a light emission control line, and the like (not illustrated).

The first metal layer, the second metal layer, and the third metal layer described above are each formed of a single layer film or a multi-layer film of metal, the metal including at least one of aluminum, tungsten, molybdenum, tantalum, chromium, titanium, and copper, for example.

The inorganic insulating films 16, 18, and 20 can be formed of, for example, a silicon oxide (SiOx) film or a silicon nitride (SiNx) film, or a layered film of these, formed using CVD. The flattening film 21 can be formed of, for example, a coatable organic material such as polyimide or acrylic resin.

The light-emitting element layer 5 includes a first electrode (anode electrode) 22 as an upper layer overlying the flattening film 21, an edge cover film 23 having insulating properties and covering an edge of the first electrode 22, a function layer 24 as an upper layer overlying the edge cover film 23, and a second electrode (cathode electrode) 25 as an upper layer overlying the function layer 24. That is, the light-emitting element layer 5 is formed with a plurality of the light-emitting elements X, each including the first electrode 22, a light-emitting layer described below included in the function layer 24, and the second electrode 25, and each having a different luminescent color. The edge cover film 23 is formed by applying an organic material such as polyimide or an acrylic resin and then patterning the organic material by photolithography, for example. This edge cover film 23 overlaps an end portion of a surface of the first electrode 22 having an island shape to partition a pixel (subpixel SP). The edge cover film 23 is a bank that defines the plurality of pixels (subpixels SP) corresponding to each of the plurality of light-emitting elements X. The function layer 24 is an electroluminescence (EL) layer including an electroluminescence element.

The light-emitting element layer 5 is formed with a light-emitting element Xr (red), a light-emitting element Xg (green), and a light-emitting element Xb (blue) having luminescent colors different from each other and included in the light-emitting element X described above. Each light-emitting element X includes the first electrode 22, the function layer 24 (including the light-emitting layer), and the second electrode 25. The first electrode 22 is an island-shaped electrode provided for each light-emitting element X (that is, subpixel SP). The second electrode 25 is a solid-like common electrode common to all light-emitting elements X. Furthermore, the light-emitting element Xr (red), the light-emitting element Xg (green), and the light-emitting element Xb (blue) are included in the subpixel SPr, the subpixel SPg, and the subpixel SPb, respectively.

Each of the light-emitting elements Xr, Xg, and Xb is, for example, a quantum dot light-emitting diode (QLED) in which the light-emitting layer described below is a quantum dot light-emitting layer.

For example, the function layer 24 includes a hole injection layer 24*a*, a hole transport layer 24*b*, a light-emitting layer 24*c*, an electron transport layer 24*d*, and an electron injection layer 24*e* layered in this order from the lower layer side. An electron blocking layer and a hole blocking layer may also be provided in the function layer 24. The light-emitting layer 24*c* is applied by a dropping technique such as a spin-coating method or ink-jet printing method, and subsequently formed in an island shape by patterning. Other layers are formed in an island shape or a solid-like shape (common layer). In the function layer 24, a configuration may be adopted in which one or more layers of the hole injection layer 24*a*, the hole transport layer 24*b*, the electron transport layer 24*d*, and the electron injection layer 24*e* are not formed.

The display device 2 according to the present embodiment has a so-called conventional structure in which the anode electrode (first electrode 22), the function layer 24, and the cathode electrode (second electrode 25) are provided in this order from the thin film transistor layer 4 side, as exemplified in FIG. 2.

As illustrated in FIG. 4, in the display device 2 of the present embodiment, the light-emitting elements Xr, Xg, and Xb are partitioned by the edge cover film 23 serving as a bank. Each light-emitting element X is provided with the first electrode 22 having an island shape, the hole injection layer 24*a* having an island shape, the hole transport layer 24*b* having an island shape, and a light-emitting layer 24*cr*, 24*cg*, or 24*cb* having an island shape (collectively referred to as the light-emitting layer 24*c*). The light-emitting element X is provided with the solid-like electron transport layer 24*d*, the solid-like electron injection layer 24*e*, and the solid-like second electrode 25 that are common to all subpixels SP.

The light-emitting layer 24*c* is the quantum dot light-emitting layer of the QLED including quantum dots, the quantum dot light-emitting layer (corresponding to one subpixel SP) in an island shape being able to be formed by applying of a solution in which quantum dots are diffused in a solvent and patterning by photolithography method, for example.

In the light-emitting elements Xr, Xg, and Xb, positive holes and electrons recombine inside the light-emitting layer 24*c* in response to a drive current between the first electrode 22 and the second electrode 25, and light (fluorescence) is emitted when the excitons generated in this manner transition from the conduction band level of the quantum dots to the valence band level.

In the display device 2 according to the present embodiment, the red light-emitting element Xr includes a red quantum dot light-emitting layer that emits red light, the green light-emitting element Xg includes a green quantum dot light-emitting layer that emit green light, and the blue light-emitting element Xb includes a blue quantum dot light-emitting layer that emit blue light.

The light-emitting layer 24$c$ includes quantum dots as a functional material (luminescent material) contributing to the function of the light-emitting layer 24$c$. In each of the light-emitting layers 24$cr$, 24$cg$, and 24$cb$ of each color, at least the particle sizes of the quantum dots are configured to be different from each other in accordance with the light emission spectrum (details will be described below). Each of the light-emitting layers 24$cr$, 24$cg$, and 24$cb$ is formed of a layered body having a three layer structure including a quantum dot light-emitting layer that contributes to the light emission and two non-light-emitting layers that do not contribute to light emission, as will be described in detail later.

The first electrode (anode electrode) 22 is composed of layering of indium tin oxide (ITO), indium zinc oxide (IZO) and silver (Ag), Al, or an alloy including Ag or Al, for example, and has light reflectivity. The second electrode (cathode electrode) 25 is a transparent electrode which is composed of, for example, a thin film of Ag, Au, Pt, Ni, Ir, or Al, a thin film of a MgAg alloy, or a light-transmissive conductive material such as ITO, or indium zinc oxide (IZO). Note that, other than those described, the configuration may be one in which a metal nanowire such as silver is used to form the second electrode 25, for example. When the second electrode 25, which is a solid-like common electrode on the upper layer side, is formed using such a metal nanowire, the second electrode 25 can be provided by applying a solution including the metal nanowire. As a result, in the light-emitting element layer 5 of the display device 2, each layer of the function layer 24 and the second electrode 25, other than the first electrode 22, can be formed by a dropping technique using a predetermined solution, making it possible to easily configure the display device 2 of simple manufacture.

The sealing layer 6 has a light-transmitting property, and includes an inorganic sealing film 26 directly formed on the second electrode 25 (in contact with the second electrode 25), an organic film 27 as an upper layer overlying the inorganic sealing film 26, and an inorganic sealing film 28 as an upper layer overlying the organic film 27. The sealing layer 6 covering the light-emitting element layer 5 inhibits foreign matters such as water and oxygen from penetrating the light-emitting element layer 5. Note that, when the light-emitting layer 24$c$ is constituted by a quantum dot light-emitting layer, installation of the sealing layer 6 can be omitted.

The organic film 27 has a flattening effect and is transparent, and can be formed by, for example, ink-jet application using a coatable organic material. The inorganic sealing films 26 and 28 are inorganic insulating films and can be formed of a silicon oxide film, a silicon nitride film, a silicon oxynitride film, or a layered film of these, formed by CVD, for example.

A function film 39 has at least one of an optical compensation function, a touch sensor function, a protection function, and the like.

Figure 5:
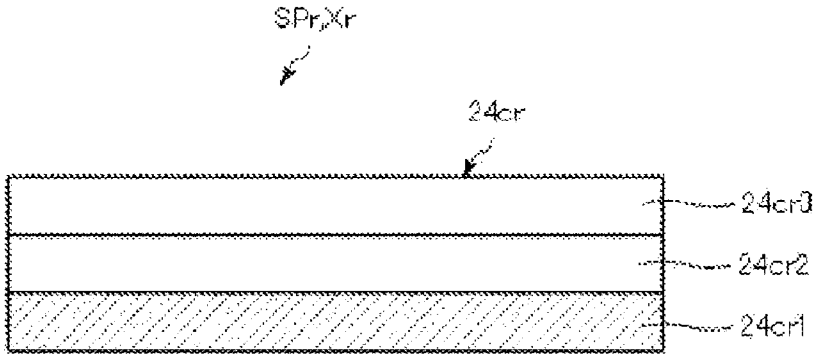
FIG. 5 is an explanatory view illustrating a specific configuration of the light-emitting layer in a subpixel, FIG. 5(*a*) being an explanatory view illustrating a specific configuration of the light-emitting layer in a red subpixel, FIG. 5(*b*) being an explanatory view illustrating a specific configuration of the light-emitting layer in a green subpixel, and FIG. 5(*c*) being an explanatory view illustrating a specific configuration of the light-emitting layer in a blue subpixel.
Figure 5:
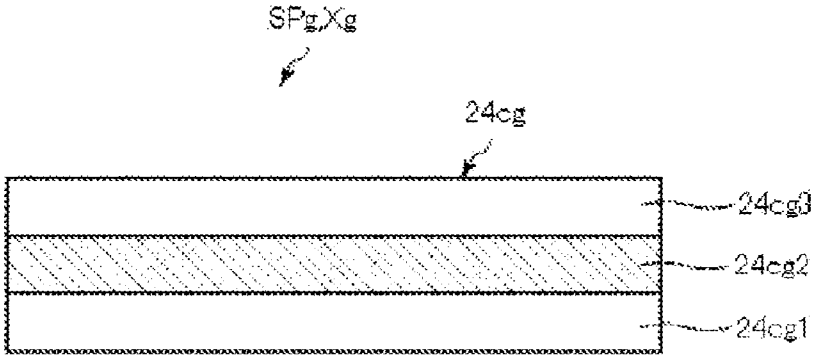
Figure 5:
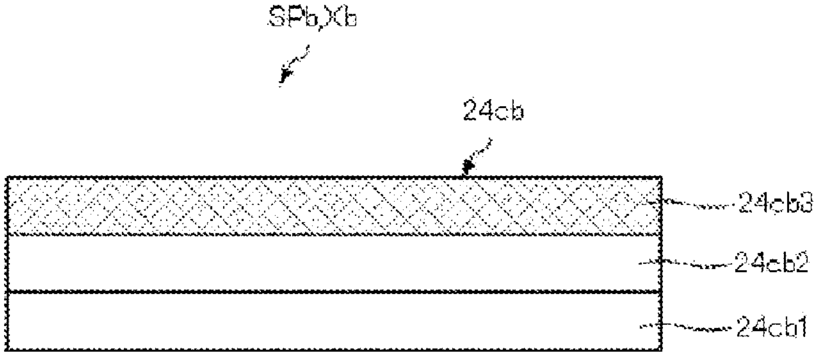

A specific configuration of the light-emitting layers 24$cr$, 24$cg$, and 24$cb$ will be described with also reference to FIG. 5. FIG. 5 is an explanatory view illustrating a specific configuration of the light-emitting layer in a subpixel, FIG. 5($a$) being an explanatory view illustrating a specific configuration of the light-emitting layer in a red subpixel, FIG. 5($b$) being an explanatory view illustrating a specific configuration of the light-emitting layer in a green subpixel, and FIG. 5($c$) being an explanatory view illustrating a specific configuration of the light-emitting layer in a blue subpixel.

As illustrated in FIG. 5($a$), the light-emitting layer 24$cr$ is included in the light-emitting element Xr of the red subpixel SPr (first subpixel), and includes a first quantum dot layer 24$cr$1, a second quantum dot layer 24$cr$2, and a third quantum dot layer 24$cr$3 sequentially layered from the first electrode 22 (FIG. 2) side toward the second electrode 25 (FIG. 2). The first quantum dot layer 24$cr$1, the second quantum dot layer 24$cr$2, and the third quantum dot layer 24$cr$3 include first quantum dots, second quantum dots, and third quantum dots, respectively.

The first quantum dots, the second quantum dots, and the third quantum dots are selected from the group consisting of, for example, CdSe-based or cadmium-free quantum dots, such as InP-based, ZnSe-based, and PbS-based. Furthermore, the particle sizes of the first quantum dots, the second quantum dots, and the third quantum dots are different from each other. Specifically, the particle size of each of the first quantum dots is from 8 nm to 11 nm, and red light can be emitted. The particle size of each of the second quantum dots is from 5 nm to 8 nm, and green light can be emitted. The particle size of each of the third quantum dots is from 2 nm to 3 nm, and blue light can be emitted.

In the light-emitting layer 24$cr$, as illustrated by hatching in FIG. 5($a$), only the first quantum dot layer 24$cr$1 constitutes a red quantum dot light-emitting layer that contributes to light emission of red light. The second quantum dot layer 24$cr$2 and the third quantum dot layer 24$cr$3, whose second quantum dots and third quantum dots are made non-light-emitting by being subjected to a first oxidation treatment to be described later, constitute non-light-emitting layers that do not contribute to light emission.

As illustrated in FIG. 5($b$), the light-emitting layer 24$cg$ is included in the light-emitting element Xg of the green subpixel SPg (second subpixel), and includes a first quantum dot layer 24$cg$1, a second quantum dot layer 24$cg$2, and a third quantum dot layer 24$cg$3 sequentially layered from the first electrode 22 (FIG. 2) side toward the second electrode 25 (FIG. 2). The first quantum dot layer 24$cg$1, the second quantum dot layer 24$cg$2, and the third quantum dot layer 24$cg$3 include the first quantum dots, the second quantum dots, and the third quantum dots, respectively.

In the light-emitting layer 24$cg$, as illustrated by hatching in FIG. 5($b$), only the second quantum dot layer 24$cg$2 constitutes a green quantum dot light-emitting layer that contributes to light emission of green light. The first quantum dot layer 24$cg$1 and the third quantum dot layer 24$cg$3, whose first quantum dots and third quantum dots are made non-light-emitting by being subjected to a second oxidation treatment to be described later, constitute non-light-emitting layers that do not contribute to light emission.

As illustrated in FIG. 5($c$), the light-emitting layer 24$cb$ is included in the light-emitting element Xb of the blue subpixel SPb (third subpixel), and includes a first quantum dot layer 24$cb$1, a second quantum dot layer 24$cb$2, and a third quantum dot layer 24$cb$3 sequentially layered from the first electrode 22 (FIG. 2) side toward the second electrode 25 (FIG. 2). The first quantum dot layer 24$cb$1, the second quantum dot layer 24$cb$2, and the third quantum dot layer 24$cb$3 include the first quantum dots, the second quantum dots, and the third quantum dots, respectively.

In the light-emitting layer 24$cb$, as illustrated by hatching in FIG. 5($c$), only the third quantum dot layer 24$cb$3 constitutes a blue quantum dot light-emitting layer that contributes to light emission of blue light. The first quantum dot layer 24$cb$1 and the second quantum dot layer 24$cb$2, whose first quantum dots and the second quantum dots are made non-light-emitting by being subjected the first quantum dots and the second quantum dots to a third oxidation treatment to be described later, constitute non-light-emitting layers that do not contribute to light emission.

The conductivity of quantum dots contained in the non-light-emitting layers among the first quantum dots, the second quantum dots, and the third quantum dots is lower than the conductivity of quantum dots contained in the quantum dot light-emitting layer among the first quantum dots, the second quantum dots, and the third quantum dots. That is, in the first quantum dots, the second quantum dots, and the third quantum dots, the resistivity of the quantum dots contained in the non-light-emitting layers is made higher than the resistivity of the quantum dots contained in the quantum dot light-emitting layer due to any one of the first, second, and third oxidation treatment. Specifically, the resistivity of the quantum dots contained in the non-light-emitting layers is, for example, 10 Ω·cm or more, and the resistivity of the quantum dots contained in the quantum dot light-emitting layer is, for example, 0.1 Ω·cm or less. Thus, in the non-light-emitting layer, conduction of positive holes and electrons is inhibited, and recombination of the positive holes and the electrons is also inhibited to make the non-light-emitting layers non-light-emitting. Note that the term “non-light-emitting” may also include a case where light emission luminance is significantly lower than light emission luminance of the quantum dot light-emitting layer (for example, light emission luminance of 36% or less of the light emission luminance of the quantum dot light-emitting layer).

In the light-emitting layers 24*cr*, 24*cg*, and 24*cb*, the first quantum dot layers 24*cr*1, 24*cg*1, and 24*cb*1 are formed simultaneously, the second quantum dot layers 24*cr*2, 24*cg*2, and 24*cb*2 are formed simultaneously, and the third quantum dot layers 24*cr*3, 24*cg*3, and 24*cb*3 are formed simultaneously (details will be described later). The film thickness of each of the first quantum dot layers 24*cr*1, 24*cg*1, and 24*cb*1, the second quantum dot layers 24*cr*2, 24*cg*2, and 24*cb*2, and the third quantum dot layers 24*cr*3, 24*cg*3, and 24*cb*3 has, for example, a value in a range from 10 nm to 70 nm.

In the light-emitting layers 24*cr*, 24*cg*, and 24*cb* in the subpixels SPr, SPg, and SPb, the total film thicknesses of the first quantum dot layers 24*cr*1, 24*cg*1, and 24*cb*1, the second quantum dot layers 24*cr*2, 24*cg*2, and the 24*cb*2, and the third quantum dot layers 24*cr*3, 24*cg*3, and 24*cb*3 have substantially the same value. In each of the subpixel SPr, SPg, and SPb, the film thickness of the quantum dot light-emitting layer is set to a value different from the film thickness of the quantum dot light-emitting layer included in each of the other two subpixels. Specifically, in the subpixels SPr, SPg, and SPb, for example, the third quantum dot light-emitting layer 24*cb*3 that emits blue light, the first quantum dot light-emitting layer 24*cr*1 that emits the red light, and the second quantum dot light-emitting layer 24*cg*2 that emit green light have film thicknesses that decrease in this order. As a result, the light emission luminance of the subpixel SP having low luminosity factor is increased, that is, the light emission luminance of the blue subpixel SPb is maximized, subsequently the light emission luminance of the red subpixel SPr is increased, and lastly the light emission luminance of the green subpixel SPg is minimized. Note that, other than this description, the third quantum dot light-emitting layer 24*cb*3 that emits blue light, the second quantum dot light-emitting layer 24*cg*2 that emit green light, and the first quantum dot light-emitting layer 24*cr*1 that emits the red light may have film thicknesses that decrease in this order. In such a configuration, the emission balance of the red light, the green light, and the blue light can be easily adjusted in consideration of emission efficiency in the first quantum dot light-emitting layer 24*cr*1, the second quantum dot light-emitting layer 24*cg*2, and the third quantum dot light-emitting layer 24*cb*3, and thus the emission quality can be easily improved.

In the display device 2 according to the present embodiment, the hole transport layer 24*b* serving as the first charge transport layer is provided between the first electrode 22 and each of the first quantum dot layers 24*cr*1, 24*cg*1, and 24*cb*1. The electron transport layer 24*d* serving as the second charge transport layer is provided between the second electrode 25 and each of the third quantum dot layers 24*cr*3, 24*cg*3, and 24*cb*3. That is, the hole transport layer 24*b* and the electron transport layer 24*d* sandwich one quantum dot light-emitting layer and two non-light-emitting layers.

In the display device 2 according to the present embodiment, at least one of the hole transport layer 24*b* and the electron transport layer 24*d* is formed as a common layer provided in common to all of the subpixels SPs of the subpixels SPr, SPg, and SPb to simplify the manufacturing process of the display device 2.

In the display device 2 according to the present embodiment, the first electrode 22 is a pixel electrode provided for each subpixel SP of the subpixels SPr, SPg, and SPb. The second electrode 25 is a common electrode provided in common to all of the subpixels SPs of the subpixels SPr, SPg, and SPb.

Figure 6:
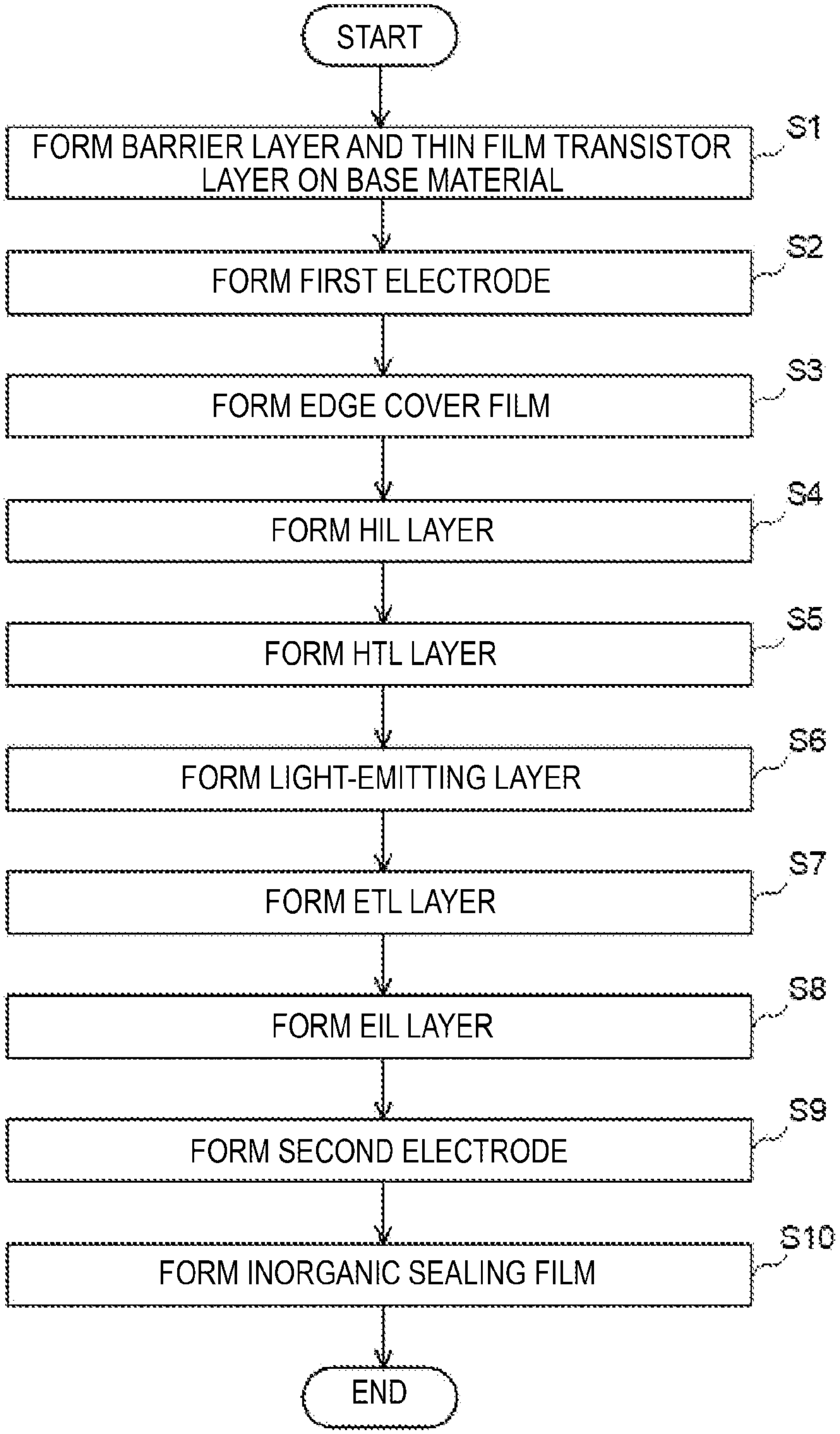
FIG. 6 is a flowchart illustrating a method for manufacturing the display device described above.

Next, with reference to FIG. 6 as well, a method for manufacturing the display device 2 of the present embodiment will be specifically described. FIG. 6 is a flowchart illustrating a method for manufacturing the display device described above.

As illustrated in FIG. 5, in the method for manufacturing the display device 2 of the present embodiment, first, the barrier layer 3 and the thin film transistor layer 4 are formed on the base material 12 (step S1). Next, the first electrode (anode electrode) 22 is formed on the flattening film 21 by using, for example, a sputtering method and a photolithography method (step S2). Then, the edge cover film 23 is formed (step S3).

Next, the hole injection layer (HIL) 24*a* is formed by a dropping technique such as an ink-jet printing method (step S4). Specifically, in this hole injection layer formation process, 2-propanol, butyl benzoate, toluene, chlorobenzene, tetrahydrofuran, or 1,4 dioxane, for example, is used as a solvent included in a solution for hole injection layer formation. For example, a polythiophene-based conductive material such as PEDOT:PSS, or an inorganic compound such as nickel oxide or tungsten oxide, is used as a solute, that is, hole injection material (functional material), included in the solution for hole injection layer formation. Then, in this HIL layer formation process, the hole injection layer 24*a* having a film thickness of, for example, from 20 nm to 50 nm is formed by baking, at a predetermined temperature, the solution for hole injection layer formation, that has been dropped onto the first electrode 22.

Then, the hole transport layer (HTL) 24*b* is formed by a dropping technique such as an ink-jet printing method (step S5). Specifically, in this hole transport layer formation process, chlorobenzene, toluene, tetrahydrofuran, or 1,4 dioxane, for example, is used as a solvent included in a solution for hole transport layer formation. As a solute, that is, hole transport material (functional material), included in the solution for hole transport layer formation, for example, an organic polymer compound such as poly(9,9-dioctylfluorene-alt-N-(4-sec-butylphenyl)-diphenylamine) (TFB), polyvinylcarbazole (PVK), or poly-TPD, or an inorganic compound such as nickel oxide is used. Then, in this HTL layer formation process, the hole transport layer 24*b* having a film thickness of, for example, from 20 nm to 50 nm is formed by baking, at a predetermined temperature, the solution for hole transport layer formation that has been dropped onto the hole injection layer 24*a*.

Next, the light-emitting layer (EML) 24*c* is formed by a dropping technique such as an ink-jet printing method (step S6). Specifically, in this light-emitting layer formation process, for example, toluene or propylene glycol monomethyl ether acetate (PGMEA) is used as the solvent included in a solution for light-emitting layer formation. As the solvent, that is, the luminescent material (functional material), quantum dots including CdSe-based or InP-based, ZnSe-based, and PbS-based are used, for example.

Figure 7:
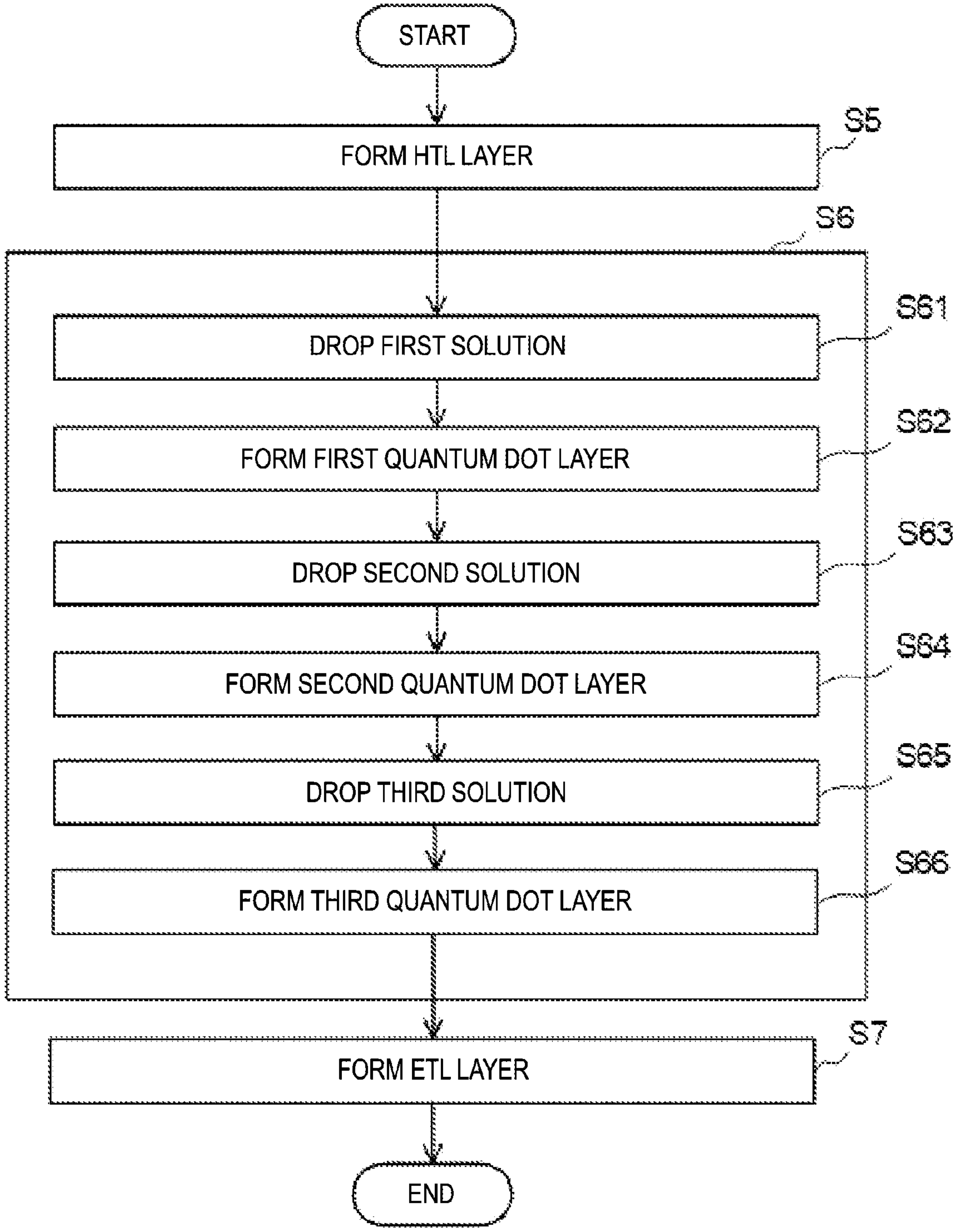
FIG. 7 is a flowchart illustrating a specific method for manufacturing the configuration of the main portions of the display device described above.

Here, the light-emitting layer formation process will be described in detail with reference to FIG. 7 as well. FIG. 7 is a flowchart illustrating a specific method for manufacturing a configuration of the main portions of the display device described above.

As illustrated in FIG. 7, in the light-emitting layer formation process, first, a step of forming the first quantum dot layers 24*cr*1, 24*cg*1, and 24*cb*1 on the hole transport layer 24*b* is performed. Specifically, as illustrated in step S61 in FIG. 7, a first solution dropping step is performed in which a first solution is dropped onto the first electrode 22, the first solution containing the first quantum dots and for forming the first quantum dot layers 24*cr*1, 24*cg*1, and 24*cb*1.

Next, as illustrated in step S62 in FIG. 7, a first quantum dot layer forming step is performed. In the first quantum dot layer forming step, a first oxidation treatment is performed with respect to a drop region corresponding to the subpixel SPg and a drop region corresponding to the subpixel SPb, excluding a drop region corresponding to the subpixel SPr, among a drop region of the first solution dropped, so that the quantum dot light-emitting layer in which the first quantum dot layer 24*cr*1 contributes to light emission is formed in the drop region corresponding to the subpixel Spr, and the non-light-emitting layers in which the first quantum dot layers 24*cg*1 and 24*cb*1 do not contribute to light emission are formed in the drop region corresponding to the subpixel SPg and the drop region corresponding to the subpixel SPb.

Subsequently, as illustrated in step S63 of FIG. 7, a second solution dropping step is performed in which a second solution is dropped onto the first quantum dot layers 24*cr*1, 24*cg*1, and 24*cb*1, the second solution containing the second quantum dots and for forming the second quantum dot layers 24*cr*2, 24*cg*2, and 24*cb*2.

Next, as illustrated in step S64 of FIG. 7, a second quantum dot layer forming step is performed. In the second quantum dot layer forming step, a second oxidation treatment is performed with respect to a drop region corresponding to the subpixel SPr and a drop region corresponding to the subpixel SPb, excluding a drop region corresponding to the subpixel SPg, among a drop region of the second solution dropped, so that the quantum dot light-emitting layer in which the second quantum dot layer 24*cg*2 contributes to light emission is formed in the drop region corresponding to the subpixel SPg, and the non-light-emitting layers in which the second quantum dot layers 24*cr*2 and 24*cb*2 do not contribute to light emission are formed in the drop region corresponding to the subpixel SPr and the drop region corresponding to the subpixel SPb.

Subsequently, as illustrated in step S65 in FIG. 7, a third solution dropping step is performed in which a third solution is dropped onto the second quantum dot layers 24*cr*2, 24*cg*2, and 24*cb*2, the third solution containing the third quantum dots and for forming the third quantum dot layers 24*cr*3, 24*cg*3, and 24*cb*3.

Next, as illustrated in step S66 in FIG. 7, a third quantum dot layer forming step is performed. In the third quantum dot layer forming step, a third oxidation treatment is performed with respect to a drop region corresponding to the subpixel SPr and a drop region corresponding to the subpixel SPg, excluding a drop region corresponding to the subpixel SPb, among a drop region of the third solution dropped, so that the quantum dot light-emitting layer in which the third quantum dot layer 24*cb*3 contributes to light emission is formed in the drop region corresponding to the subpixel SPb and the non-light-emitting layers in which the third quantum dot layers 24*cr*3 and 24*cg*3 do not contribute to light emission are formed in the drop region corresponding to the subpixel SPr and the drop region corresponding to the subpixel SPg.

Figure 8:
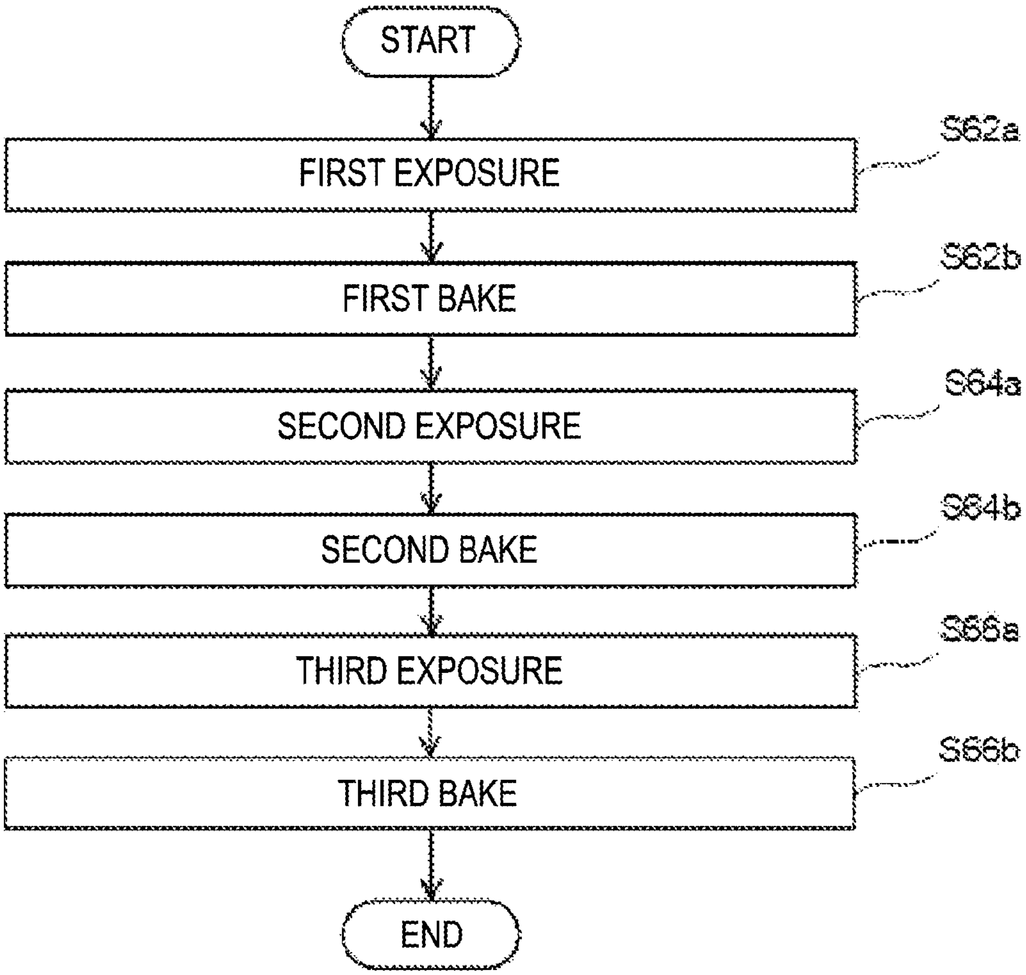
FIG. 8 is a flowchart illustrating a specific method for manufacturing the light-emitting layer of the display device described above.
Figure 9:
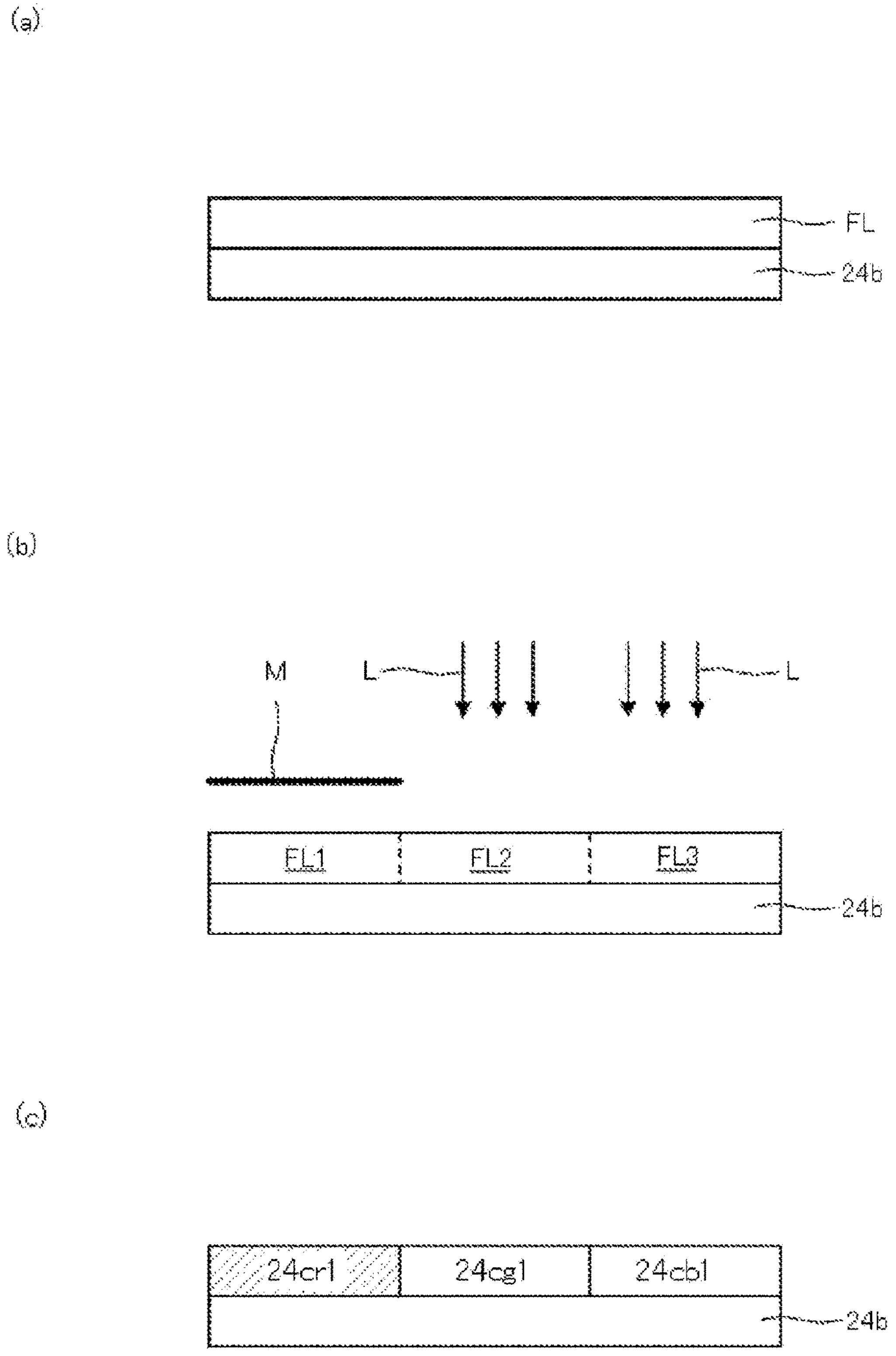
FIG. 9 is a view explaining specific manufacturing steps of the light-emitting layer in the red subpixel, FIG. 9(*a*) being a view explaining a first solution dropping step, FIG. 9(*b*) being a view explaining a first exposure step, and FIG. 9(*c*) being a view explaining a first bake step.
Figure 10:
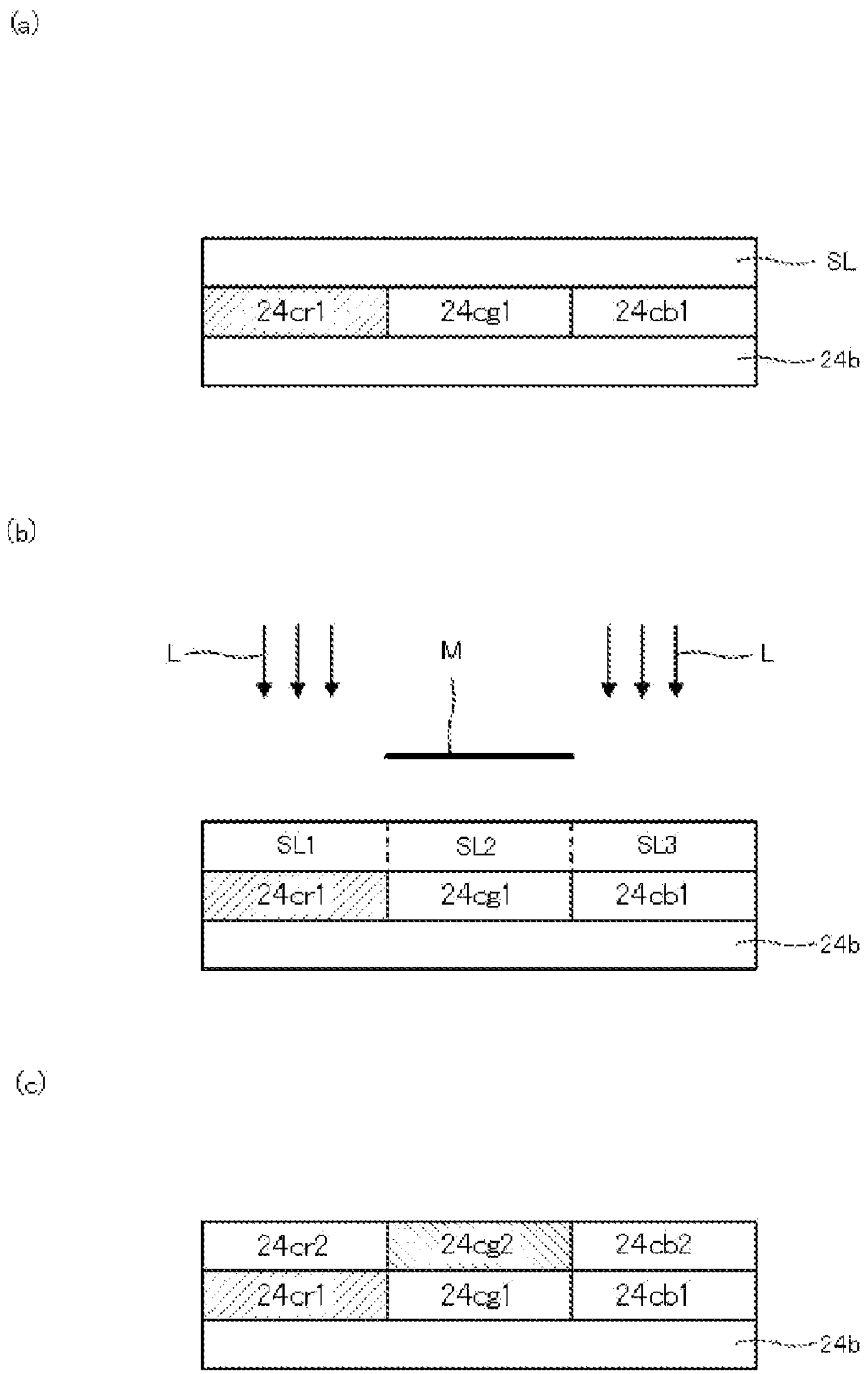
FIG. 10 is a view explaining specific manufacturing steps of the light-emitting layer in the green subpixel, FIG. 10(*a*) being a view explaining a second solution dropping step, FIG. 10(*b*) being a view explaining a second exposure step, and FIG. 10(*c*) being a view explaining a second bake step.
Figure 11:
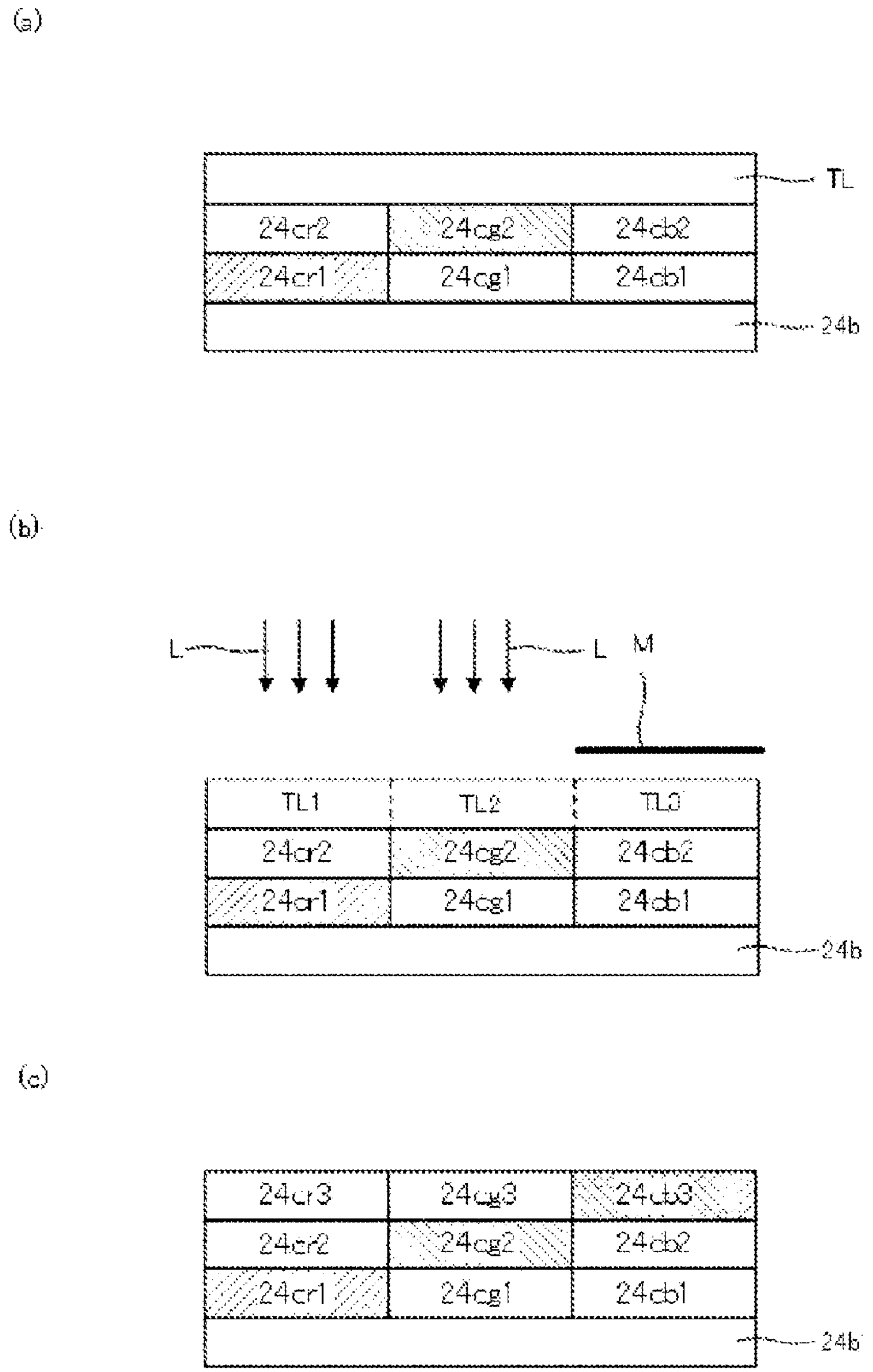
FIG. 11 is a view explaining specific manufacturing steps of the light-emitting layer in the blue subpixel, FIG. 11(*a*) being a view explaining a third solution dropping step, FIG. 11(*b*) being a view explaining a third exposure step, and FIG. 11(*c*) being a view explaining a third bake step.

Referring now to FIGS. 8 to 11, specific treatment steps of the first to third oxidation treatments will be described. FIG. 8 is a flowchart illustrating a specific method for manufacturing a light-emitting layer of the display device described above. FIG. 9 is a view explaining specific manufacturing steps of the light-emitting layer in the red subpixel, FIG. 9(*a*) being a view explaining the first solution dropping step, FIG. 9(*b*) being a view explaining a first exposure step, and FIG. 9(*c*) being a view explaining a first bake step. FIG. 10 is a view explaining specific manufacturing steps of the light-emitting layer in the green subpixel, FIG. 10(*a*) being a view explaining the second solution dropping step, FIG. 10(*b*) being a view explaining a second exposure step, and FIG. 10(*c*) being a view explaining a second bake step. FIG. 11 is a view explaining specific manufacturing steps of the light-emitting layer in the blue subpixel, FIG. 11(*a*) being a view explaining the third solution dropping step, FIG. 11(*b*) being a view explaining a third exposure step, and FIG. 11(*c*) being a view explaining a third bake step.

In the first oxidation treatment in the first quantum dot layer forming step (step S62 in FIG. 7), the first exposure step and the first bake step are sequentially performed as illustrated in step S62*a* and step S62*b* in FIG. 8. Specifically, when the first solution dropping step (step S61 in FIG. 7) is performed, a first solution FL is dropped on the hole transport layer 24*b* as illustrated in FIG. 9(*a*). Subsequently, as illustrated in FIG. 9(*b*), the first exposure step is performed in which a predetermined irradiation light L is irradiated from above an exposure mask M to a drop region FL2 corresponding to the subpixel SPg and a drop region FL3 corresponding to the subpixel SPb to perform exposure in a state where the exposure mask M is placed above a drop region FL1 corresponding to the subpixel SPr. At this time, in the drop region FL2 and the drop region FL3, for example, ultraviolet light having a wavelength of 210 nm or more and less than 365 nm is irradiated as the predetermined irradiation light L, and thus the first quantum dots contained in the drop region FL2 and the drop region FL3 are oxidized to be non-light emitting. Thereafter, as illustrated in FIG. 9(*c*), the first bake step for baking the first quantum dot layers 24*cr*1, 24*cg*1, and 24*cb*1 after the first exposure step is performed, so that the quantum dot light-emitting layer in which the first quantum dot layer 24*cr*1 contributes to light emission is formed in the drop region corresponding to the subpixel SPr, and the non-light-emitting layers in which the first quantum dot layers 24*cg*1 and 24*cb*1 do not contribute to light emission are formed in the drop region corresponding to the subpixel SPg and the drop region corresponding to the subpixel SPb. The first bake step is performed, for example, under an inert gas atmosphere such as nitrogen or argon, at 120° C. for one hour. Under such an inert gas atmosphere, it is possible to prevent contamination of impurities into the first quantum dot layers 24*cr*1, 24*cg*1, and 24*cb*1, and formation can be more appropriately performed.

In the second oxidation treatment in the second quantum dot layer forming step (step S64 in FIG. 7), the second exposure step and the second bake step are sequentially performed as illustrated in step S64*a* and step S64*b* in FIG. 8. Specifically, when the second solution dropping step (step S63 in FIG. 7) is performed, a second solution SL is dropped on the first quantum dot layers 24*cr*1, 24*cg*1, and 24*cb*1 as illustrated in FIG. 10(*a*). Subsequently, as illustrated in FIG. 10(*b*), the second exposure step is performed in which the predetermined irradiation light L is irradiated from above the exposure mask M to a drop region SL1 corresponding to the subpixel SPr and a drop region SL3 corresponding to the subpixel SPb to perform exposure in a state where the exposure mask M is placed above a drop region SL2 corresponding to the subpixel SPg. At this time, in the drop region SL1 and the drop region SL3, for example, ultraviolet light having a wavelength of 210 nm or more and less than 365 nm is irradiated as the predetermined irradiation light L, and thus the second quantum dots contained in the drop region SL1 and the drop region SL3 are oxidized to be non-light emitting. Thereafter, as illustrated in FIG. 10(*c*), the second bake step for baking the second quantum dot layers 24*cr*2, 24*cg*2, and 24*cb*2 after the second exposure step is performed, so that the quantum dot light-emitting layer in which the second quantum dot layer 24*cg*2 contributes to light emission is formed in the drop region corresponding to the subpixel SPg, and the non-light-emitting layers in which the second quantum dot layers 24*cr*2 and 24*cb*2 do not contribute to light emission are formed in the drop region corresponding to the subpixel SPr and the drop region corresponding to the subpixel SPb. The second bake step is performed, for example, under an inert gas atmosphere such as nitrogen or argon, at 120° C. for one hour. Under such an inert gas atmosphere, it is possible to prevent contamination of impurities into the second quantum dot layers 24*cr*2, 24*cg*2, and 24*cb*2, and formation can be more appropriately performed.

In the third oxidation treatment in the third quantum dot layer forming step (step S66 in FIG. 7), the third exposure step and the third bake step are sequentially performed as illustrated in step S66*a* and step S66*b* in FIG. 8. Specifically, when the third solution dropping step (step S65 in FIG. 7) is performed, a third solution TL is dropped on the second quantum dot layers 24*cr*2, 24*cg*2, and 24*cb*2 as illustrated in FIG. 11(*a*). Subsequently, as illustrated in FIG. 11(*b*), the third exposure step is performed in which the predetermined irradiation light L is irradiated from above the exposure mask M to a drop region TL1 corresponding to the subpixel SPr and a drop region TL2 corresponding to the subpixel SPg to perform exposure in a state where the exposure mask M is placed above a drop region TL3 corresponding to the subpixel SPb. At this time, in the drop region TL1 and the drop region TL2, for example, ultraviolet light having a wavelength of 210 nm or more and less than 365 nm is irradiated as the predetermined irradiation light L, and thus the third quantum dots contained in the drop region TL1 and the drop region TL2 are oxidized to be non-light emitting. Thereafter, as illustrated in FIG. 11(*c*), the third bake step for baking the third quantum dot layers 24*cr*3, 24*cg*3, and 24*cb*3 after the third exposure step is performed, so that the quantum dot light-emitting layer in which the second quantum dot layer 24*cb*3 contributes to light emission is formed in the drop region corresponding to the subpixel SPb, and the non-light-emitting layers in which the second quantum dot layers 24*cr*3 and 24*cg*3 do not contribute to light emission are formed in the drop region corresponding to the subpixel SPr and the drop region corresponding to the subpixel SPg. The second bake step is performed, for example, under an inert gas atmosphere such as nitrogen or argon, at 120° C. for one hour. Under such an inert gas atmosphere, it is possible to prevent contamination of impurities into the third quantum dot layers 24*cr*3, 24*cg*3, and 24*cb*3, and formation can be more appropriately performed.

As described above, the display device 2 can be manufactured.

In the display device 2 of the present embodiment configured as described above, the subpixel (first subpixel) SPr, the subpixel (second subpixel) SPg, and the subpixel (third subpixel) SPb having luminescent colors different from each other are provided in the display region DA. The subpixel SPr, the subpixel SPg, and the subpixel SPb include the first quantum dot layers 24*cr*1, 24*cg*1, and 24*cb*1, respectively, the second quantum dot layers 24*cr*2, 24*cg*2, and 24*cb*2, respectively, and the third quantum dot layers 24*cr*3, 24*cg*3, and 24*cb*3, respectively, which are sequentially layered from the first electrode 22 side toward the second electrode 25 side. In the subpixel SPr, the first quantum dot layer 24*cr*1 constitutes the quantum dot light-emitting layer that contributes to light emission, and the second quantum dot layer 24*cr*2 and the third quantum dot layer 24*cr*3 constitute the non-light-emitting layers that do not contribute to light emission. In the subpixel SPg, the second quantum dot layer 24*cg*2 constitutes the quantum dot light-emitting layer that contributes to light emission, and the first quantum dot layer 24*cg*1 and the third quantum dot layer 24*cg*3 constitute the non-light-emitting layers that do not contribute to light emission. In the subpixel SPb, the quantum dot light-emitting layer in which the third quantum dot layer 24*cb*3 contributes to light emission is constituted, and the non-light-emitting layers are constituted in which the first quantum dot layer 24*cb*1 and the second quantum dot layer 24*cb*2 do not contribute to light emission the third quantum dot layer 24*cb*3 constitutes the quantum dot light-emitting layer that contributes to light emission, and the first quantum dot layer 24*cb*1 and the second quantum dot layer 24*cb*2 constitute the non-light-emitting layers that do not contribute to light emission. Thus, in the display device 2 according to the present embodiment, three subpixels can be formed without using the developing solution even when the light-emitting layer having the quantum dots is color-coded using the photolithography method. As a result, in the display device 2 according to the present embodiment, it is possible to prevent the quantum dots contained in the quantum dot light-emitting layer in each subpixel from deteriorating, thereby preventing deterioration of the light emission performance and thus the display performance.

In the display device 2 according to the present embodiment, the use of the developing solution can be omitted, and thus a forming step and a development step of the resist layer can be omitted, and cost-effective display device 2 in which the method of manufacturing is simplified can be easily configured.

In the display device 2 of the present embodiment, for example, even when cadmium-free quantum dots such as InP-based, ZnSe-based, and PbS-based quantum dots are used in the light-emitting layer, it is possible to perform the color-coding with the RGB, and thus the display device excellent in safety and handling can be easily configured.

First Modified Example

Figure 12:
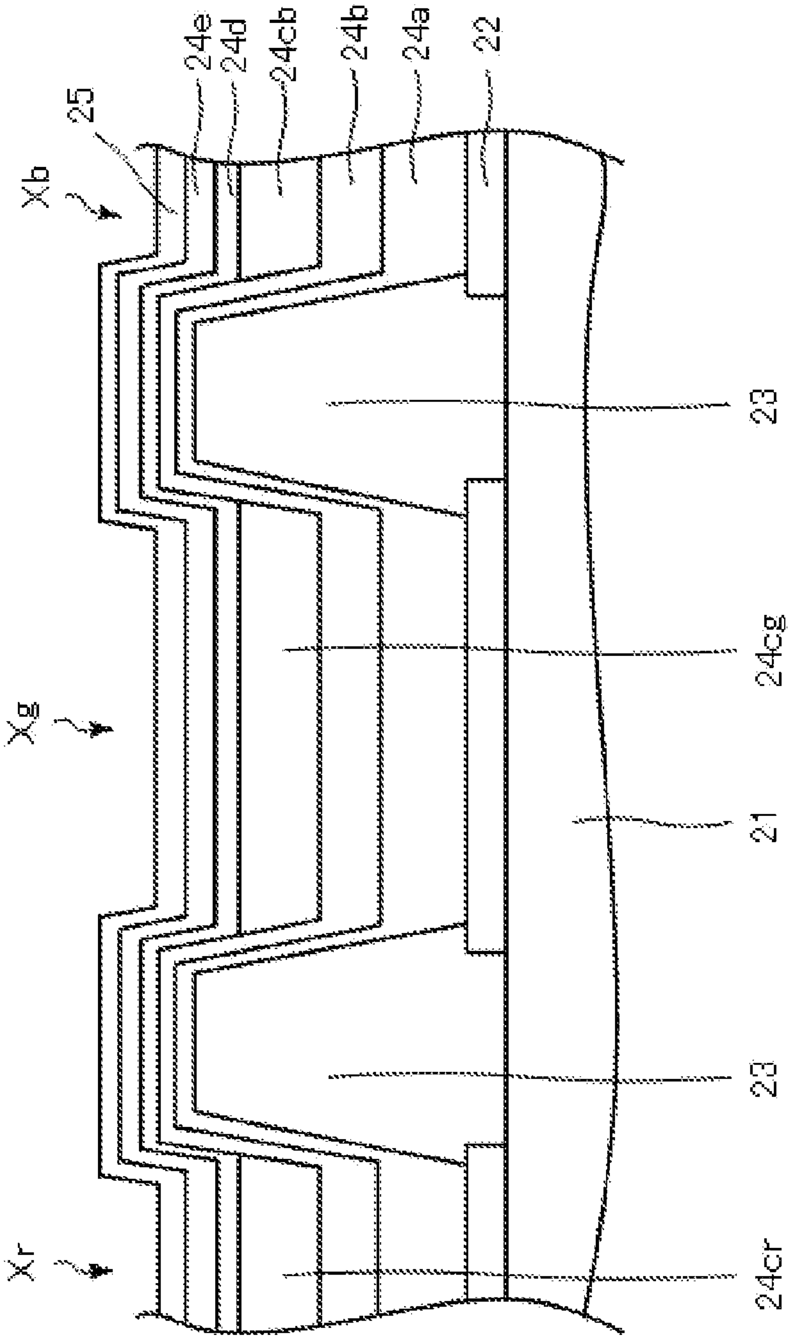
FIG. 12 is a view explaining a first modified example of the display device described above.

FIG. 12 is a view explaining a first modified example of the display device described above.

In the drawing, a main difference between this first modified example and the first embodiment described above is that the hole injection layer 24*a* and the hole transport layer 24*b* are provided as common layers common to all subpixels. Note that elements common to those in the first embodiment are denoted by the same reference signs, and duplicate description thereof will be omitted.

In the display device 2 of the first modified example, as illustrated in FIG. 12, the hole injection layer 24*a* and the hole transport layer 24*b* are formed in a solid-like manner in common to the light-emitting elements Xr, Xg, and Xb. That is, the hole injection layer 24*a* and the hole transport layer 24*b* can each be formed by the ink-jet printing method in the first embodiment as well as by other dropping techniques such as a spin-coating method.

With the above configuration, the first modified example can achieve actions and effects similar to those of the first embodiment described above. Each of the hole injection layer 24*a* and the hole transport layer 24*b* is formed as a common layer, and thus the manufacturing process of the display device 2 can be simplified as well.

Second Modified Example

FIG. 13 illustrates diagrams for explaining a configuration of the main portions of a second modified example of the display device described above, FIG. 13(*a*) being a perspective view illustrating a specific configuration of the second electrode in the second modified example, FIG. 13(*b*) being a diagram illustrating a specific configuration of the light-emitting element layer in the second modified example, and FIG. 13(*c*) being a graph showing an effect of the second modified example.

In the drawing, a main difference between this second modified example and the first embodiment described above is that the second electrode 25 including the electron injection layer and the electron transport layer is provided. Note that elements common to those in the first embodiment are denoted by the same reference signs, and duplicate description thereof will be omitted.

Figure 13:
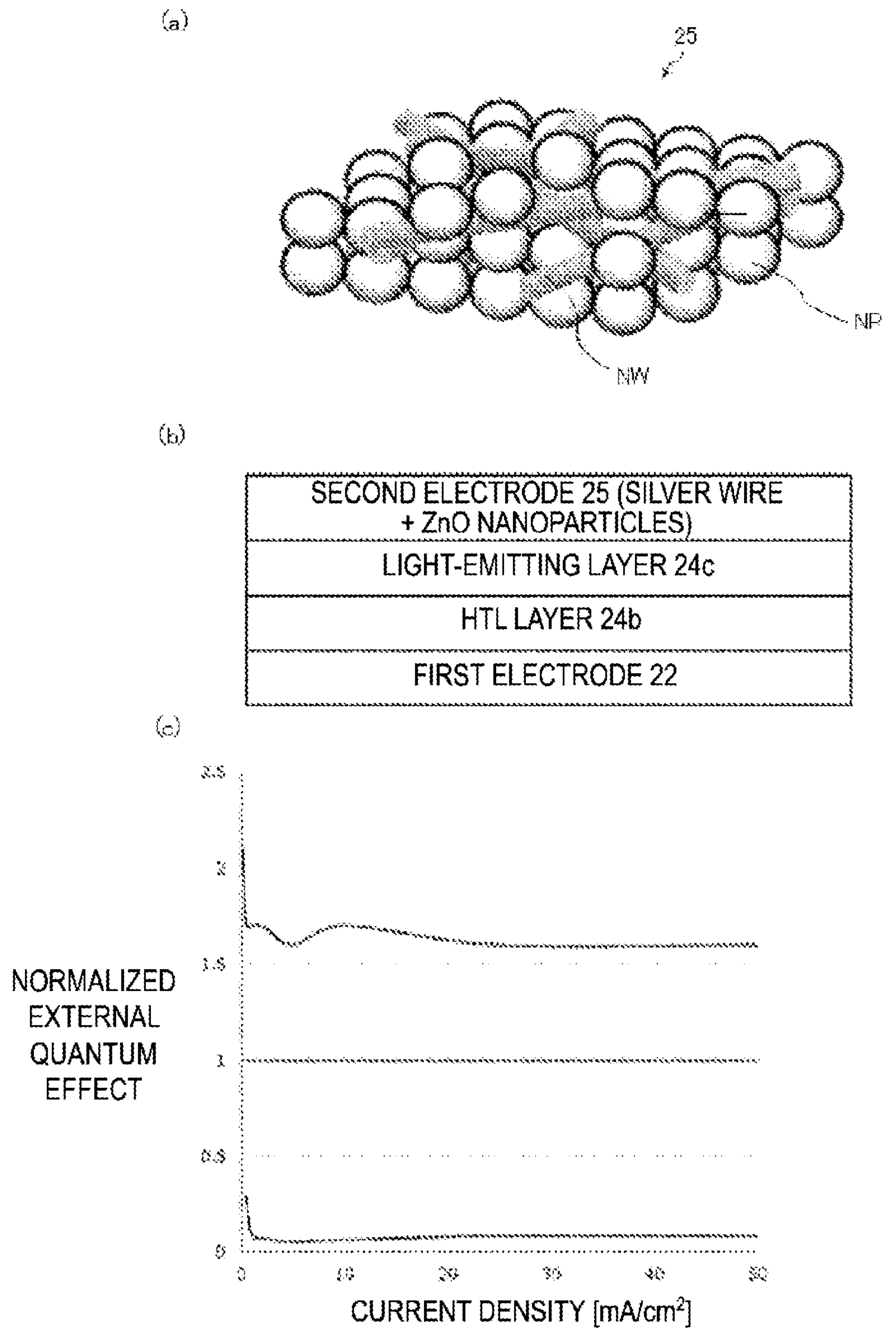
FIG. 13 illustrates diagrams for explaining a configuration of the main portions of a second modified example of the display device described above, FIG. 13(*a*) being a perspective view illustrating a specific configuration of the second electrode in the second modified example, FIG. 13(*b*) being a diagram illustrating a specific configuration of the light-emitting element layer in the second modified example, and FIG. 13(*c*) being a graph showing an effect of the second modified example.

In the display device 2 of this second modified example, as illustrated in FIG. 13(*a*), the second electrode 25 includes metal nanowires, for example, silver nanowires NW, and zinc oxide (ZnO) nanoparticles NP serving as an electron injection layer material and an electron transport material. That is, a combined solution obtained by mixing a silver nanowire solution and a zinc oxide nanoparticle solution at a desired ratio and agitating the solution is applied and then dried, thereby obtaining the second electrode 25 in which the silver nanowires NW and the zinc oxide nanoparticles NP are mixed. Specifically, the silver nanowires NW are randomly disposed in three dimensions, and a gap between the zinc oxide nanoparticles NP (average particle size from 1 to 30 nm) is configured so that the silver nanowires NW passes therethrough.

In the display device 2 of this second modified example, as illustrated in FIG. 13(*b*), the first electrode 22 (anode electrode), the HTL layer (hole transport layer) 24*b*, the light-emitting layer 24*c* (quantum dot light-emitting layer, for example), and the second electrode (common cathode electrode) 25 including the electron injection layer and the electron transport layer are provided in this order.

In the configuration illustrated in FIG. 13(*a*), a contact area, in the second electrode 25, between the silver nanowires NW and the zinc oxide nanoparticles NP serving as the electron transport material increases and thus, as shown in FIG. 13(*c*), in a range of current density from 0 to 50 [milliampere/centimeters squared], an external quantum effect UB (normalized value with respect to reference value) of the light-emitting element X in this second modified example is found to be significantly improved compared to an external quantum effect UA (reference value of each current density=1) of the light-emitting element X configured as illustrated in FIG. 3, that is, with the second electrode 25 formed on the electron injection layer (zinc oxide nanoparticle layer) 24*e* and a normalized external quantum efficiency Ua (normalized value with respect to reference value) of the light-emitting element including a cathode electrode of a general silver thin film.

The number of processes can be reduced in comparison to a case in which the electron transport layer 24*d*, the electron injection layer 24*e*, and the second electrode (common cathode) 25 are formed in separate processes.

In a case where there are too many metal nanowires NW, an electron transport performance to the light-emitting layer 24*c* deteriorates and, in a case where there are too few metal nanowires NW, a resistance value increases. Thus, a volume ratio of the metal nanowires NW to the ZnO nanoparticles NP is from 1/49 to 1/9.

With the above configuration, this second modified example can achieve actions and effects similar to those of the first embodiment described above.

Note that in the above description, the conventional structure has been described in which the anode serving as the first electrode 22 is provided on the base material 12 side and the cathode serving as the second electrode 25 is provided on the display surface side, but the present embodiment is not limited thereto, and for example, an invert structure may be employed in which the cathode serving as the first electrode 22 is provided on the base material 12 side and the anode serving as the second electrode 25 is provided on the display surface side. In the case of the invert structure, the first charge transport layer is the electron transport layer, and the second charge transport layer is the hole transport layer.

In the above description, a case has been described in which the first subpixel, the second subpixel, and the third subpixel are the red subpixel SPr, the green subpixel SPg, and the blue subpixel SPb, respectively, but the present embodiment is not limited thereto. The present embodiment is not limited at all such as a first subpixel, a second subpixel, and a third subpixel having luminescent colors different from each other are included. For example, the present embodiment may be configured in which a subpixel of white or the like in which the luminescent color is different from that of these subpixels is provided.

In the description above, a case has been described in which the red quantum dot light-emitting layer, the green quantum dot light-emitting layer, and the blue quantum dot light-emitting layer are layered in this order from the base material 12 side in the light-emitting layer 24*c*, but the present embodiment is not limited thereto.

INDUSTRIAL APPLICABILITY

The disclosure is useful to a display device and a method for manufacturing a display device that can prevent display performance deterioration even when a light-emitting layer including quantum dots is color-coded by using a photolithography method.

The invention claimed is:

1. A display device comprising:

a display region including a first subpixel, a second subpixel, and a third subpixel having luminescent colors different from each other, wherein:

each of the first subpixel, the second subpixel, and the third subpixel includes a first electrode, a second electrode, and a function layer provided between the first electrode and the second electrode, the function layer includes a first quantum dot layer containing first quantum dots, a second quantum dot layer containing second quantum dots, and a third quantum dot layer containing third quantum dots, the first quantum dot layer, the second quantum dot layer, and the third quantum dot layer are sequentially layered from the first electrode's side toward the second electrode's side, in the first subpixel, the first quantum dot layer forms a quantum dot light-emitting layer that contributes to light emission, and the second quantum dot layer and the third quantum dot layer form non-light-emitting layers that do not contribute to light emission, in the second subpixel, the second quantum dot layer forms a quantum dot light-emitting layer that contributes to light emission, and the first quantum dot layer and the third quantum dot layer form non-light-emitting layers that do not contribute to light emission, in the third subpixel, the third quantum dot layer forms a quantum dot light-emitting layer that contributes to light emission, and the first quantum dot layer and the second quantum dot layer form non-light-emitting layers that do not contribute to light emission, a resistivity of the first quantum dots contained in the non-light-emitting layers in the first quantum dot layer is higher than a resistivity of the first quantum dots contained in the quantum dot light-emitting layer in the first quantum dot layer, a resistivity of the second quantum dots contained in the non-light-emitting layers in the second quantum dot layer is higher than a resistivity of the second quantum dots contained in the quantum dot light-emitting layer in the second quantum dot layer, and a resistivity of the third quantum dots contained in the non-light-emitting layers in the third quantum dot layer is higher than a resistivity of the third quantum dots contained in the quantum dot light-emitting layer in the third quantum dot layer.

2. The display device according to claim 1, further comprising:

a first charge transport layer provided between the first electrode and the first quantum dot layer; and a second charge transport layer provided between the second electrode and the third quantum dot layer, wherein the first charge transport layer and the second charge transport layer sandwich the quantum dot light-emitting layer for one layer and the non-light-emitting layers for two layers.

3. The display device according to claim 2, wherein at least one of the first charge transport layer and the second charge transport layer is a common layer provided common to all subpixels of the first subpixel, the second subpixel, and the third subpixel.

4. The display device according to claim 1, wherein the first electrode is a pixel electrode provided for each subpixel of the first subpixel, the second subpixel, and the third subpixel, and the second electrode is a common electrode provided common to all subpixels of the first subpixel, the second subpixel, and the third subpixel.

5. The display device according to claim 1, wherein particle sizes of the first quantum dots, the second quantum dots, and the third quantum dots are different from each other.

6. The display device according to claim 1, wherein conductivity of quantum dots, among the first quantum dots, the second quantum dots, and the third quantum dots, contained in the non-light-emitting layers is lower than conductivity of quantum dots, among the first quantum dots, the second quantum dots, and the third quantum dots, contained in the quantum dot light-emitting layer.

7. The display device according to claim 1, wherein a film thickness of each of the first quantum dot layer, the second quantum dot layer, and the third quantum dot layer has a value in a range from 10 nm to 70 nm.

8. The display device according to claim 1, wherein, in each of the first subpixel, the second subpixel, and the third subpixel, a total film thickness of the first quantum dot layer, the second quantum dot layer, and the third quantum dot layer has substantially the same value, and a film thickness of the quantum dot light-emitting layer in each one of the first subpixel, the second subpixel, and the third subpixel has a value different from a film thickness of the quantum dot light-emitting layer included in each of the other two subpixels of the first subpixel, the second subpixel, and the third subpixel.

9. The display device according to claim 1, wherein, in the first subpixel, the first quantum dot layer forms a red subpixel that emits red light, in the second subpixel, the second quantum dot layer forms a green subpixel that emits green light, and in the third subpixel, the third quantum dot layer forms a blue subpixel that emits blue light.

10. The display device according to claim 9, wherein the third quantum dot layer that emits the blue light, the first quantum dot layer that emits the red light, and the second quantum dot layer that emits the green light have film thicknesses that decrease in this stated order.

11. The display device according to claim 9, wherein the third quantum dot layer that emits the blue light, the second quantum dot layer that emits the green light, and the first quantum dot layer that emits the red light have film thicknesses that decrease in this stated order.

12. The display device according to claim 1, wherein the first quantum dots, the second quantum dots, and the third quantum dots are selected from the group consisting of an InP-based material, a ZnSe-based material, and a PbS-based material.

* * * * *